United States Patent
Chung et al.

(10) Patent No.: US 12,249,646 B2
(45) Date of Patent: Mar. 11, 2025

(54) DOUBLE-DIFFUSED METAL-OXIDE-SEMICONDUCTOR TRANSISTOR INCLUDING A RECESSED DIELECTRIC

(71) Applicant: Allegro MicroSystems, LLC, Manchester, NH (US)

(72) Inventors: Thomas S. Chung, Kissimmee, FL (US); Chung C. Kuo, Manchester, NH (US); Maxim Klebanov, Palm Coast, FL (US); Sundar Chetlur, Frisco, TX (US)

(73) Assignee: Allegro MicroSystems, LLC, Manchester, NH (US)

( * ) Notice: Subject to any disclaimer, the term of this patent is extended or adjusted under 35 U.S.C. 154(b) by 548 days.

(21) Appl. No.: 17/695,029

(22) Filed: Mar. 15, 2022

(65) Prior Publication Data

US 2023/0299195 A1  Sep. 21, 2023

(51) Int. Cl.
 *H01L 29/78* (2006.01)
 *H01L 29/06* (2006.01)
 *H01L 29/08* (2006.01)

(52) U.S. Cl.
 CPC ...... *H01L 29/7816* (2013.01); *H01L 29/0634* (2013.01); *H01L 29/0852* (2013.01)

(58) Field of Classification Search
 CPC ........... H01L 29/063; H01L 29/0634; H01L 29/0653; H01L 29/66681; H01L 29/66689; H01L 21/76224; H01L 29/7816; H01L 29/0852; H01L 29/0882
 See application file for complete search history.

(56) References Cited

U.S. PATENT DOCUMENTS

| | | | |
|---|---|---|---|
| 9,929,141 B2 | 3/2018 | Kuo et al. | |
| 10,038,001 B1 | 7/2018 | Wang | |
| 10,153,366 B2 | 12/2018 | Chung et al. | |
| 10,297,605 B2 | 5/2019 | Wang | |
| 10,468,485 B2 | 11/2019 | Chetlur et al. | |
| 10,916,438 B2 | 2/2021 | Klebanov et al. | |
| 2015/0097236 A1* | 4/2015 | Tsai | H01L 21/324 438/286 |

(Continued)

OTHER PUBLICATIONS

Hd et al., "Reduced Surface Field Technology for LDMOS: A Review;" International Journal of Emerging Technology and Advanced Engineering, vol. 4, Issue 6; Jun. 2014; 4 Pages.

*Primary Examiner* — Davienne N Monbleau
*Assistant Examiner* — Emily Nicole Farmer
(74) *Attorney, Agent, or Firm* — DALY, CROWLEY, MOFFORD & DURKEE, LLP

(57) ABSTRACT

In one aspect, a double-diffused metal oxide semiconductor (DMOS) includes a region of a semiconductor having a first region of a semiconductor having a first-type dopant, a first well having a second-type dopant, a dielectric within the first well, the dielectric having a bottom surface and a top surface opposite the bottom surface, a gate disposed on the top surface of the dielectric. The gate, the dielectric and the first well are configured to form a first reduced surface field (RESURF). The bottom surface of the dielectric has a first portion and a second portion, and the first portion of the bottom surface of the dielectric is closer to the top surface of the dielectric than the second portion of the bottom surface of the dielectric.

10 Claims, 3 Drawing Sheets

(56) References Cited

U.S. PATENT DOCUMENTS

2015/0137229 A1\* 5/2015 Sulistyanto ....... H01L 29/42368
  438/286
2016/0284801 A1\* 9/2016 Mori ................... H01L 29/0653

\* cited by examiner

DOUBLE-DIFFUSED METAL-OXIDE-SEMICONDUCTOR TRANSISTOR INCLUDING A RECESSED DIELECTRIC

BACKGROUND

A reduced surface field (RESURF) has been used to fabricate high-voltage linear devices such as for example lateral double-diffused metal-oxide-semiconductor (LDMOS). It is desirable to have a high-voltage linear device that has a high breakdown voltage and has a low on-resistance.

SUMMARY

In one aspect, a double-diffused metal oxide semiconductor (DMOS) includes a region of a semiconductor having a first region of a semiconductor having a first-type dopant, a first well having a second-type dopant, a dielectric within the first well, the dielectric having a bottom surface and a top surface opposite the bottom surface, a gate disposed on the top surface of the dielectric. The gate, the dielectric and the first well are configured to form a first reduced surface field (RESURF). The bottom surface of the dielectric has a first portion and a second portion, and the first portion of the bottom surface of the dielectric is closer to the top surface of the dielectric than the second portion of the bottom surface of the dielectric.

In another aspect, a method includes forming a double-diffused metal oxide semiconductor. The forming includes depositing a first silicon nitride on a well, depositing a first photoresist on the first silicon nitride, using a first photolithographic process to remove portions of the first photoresist to expose at least one portion of the first silicon nitride, performing a first etching of the first silicon nitride and the well depositing a first dielectric on a portion of the well etched by the first etching, removing the first silicon nitride, depositing a second silicon nitride on the well and an epitaxial layer, depositing a second photoresist on the second silicon nitride, using a second photolithographic process to remove portions of the second photoresist to expose at least one portion of the second silicon nitride, performing a second etching of the second silicon nitride, the well and the epitaxial layer, and depositing a second dielectric on a portion of the well and the epitaxial layer etched by the second etching. The second dielectric is in direct contact with the first dielectric.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a double-diffused metal-oxide-semiconductor (DMOS) transistor that includes a recessed dielectric and a non-recessed dielectric that is not recessed. In one example, the recessed dielectric enables a shorter electron path, which decreases an on-resistance of the DMOS transistor. In one example, the non-recessed dielectric provides an increased breakdown voltage by withstanding high voltage that may be applied to a drain of the DMOS transistor. In one example, the techniques described herein enable fabrication of a DMOS transistor that requires low Rsp (specific resistance) by reducing a width of a dielectric. The techniques described herein also enable the fabrication of a DMOS transistor that includes three reduced surface fields (RESURFs) to also increase a breakdown voltage of the DMOS and lower a Rsp of the DMOS.

Figure 1:
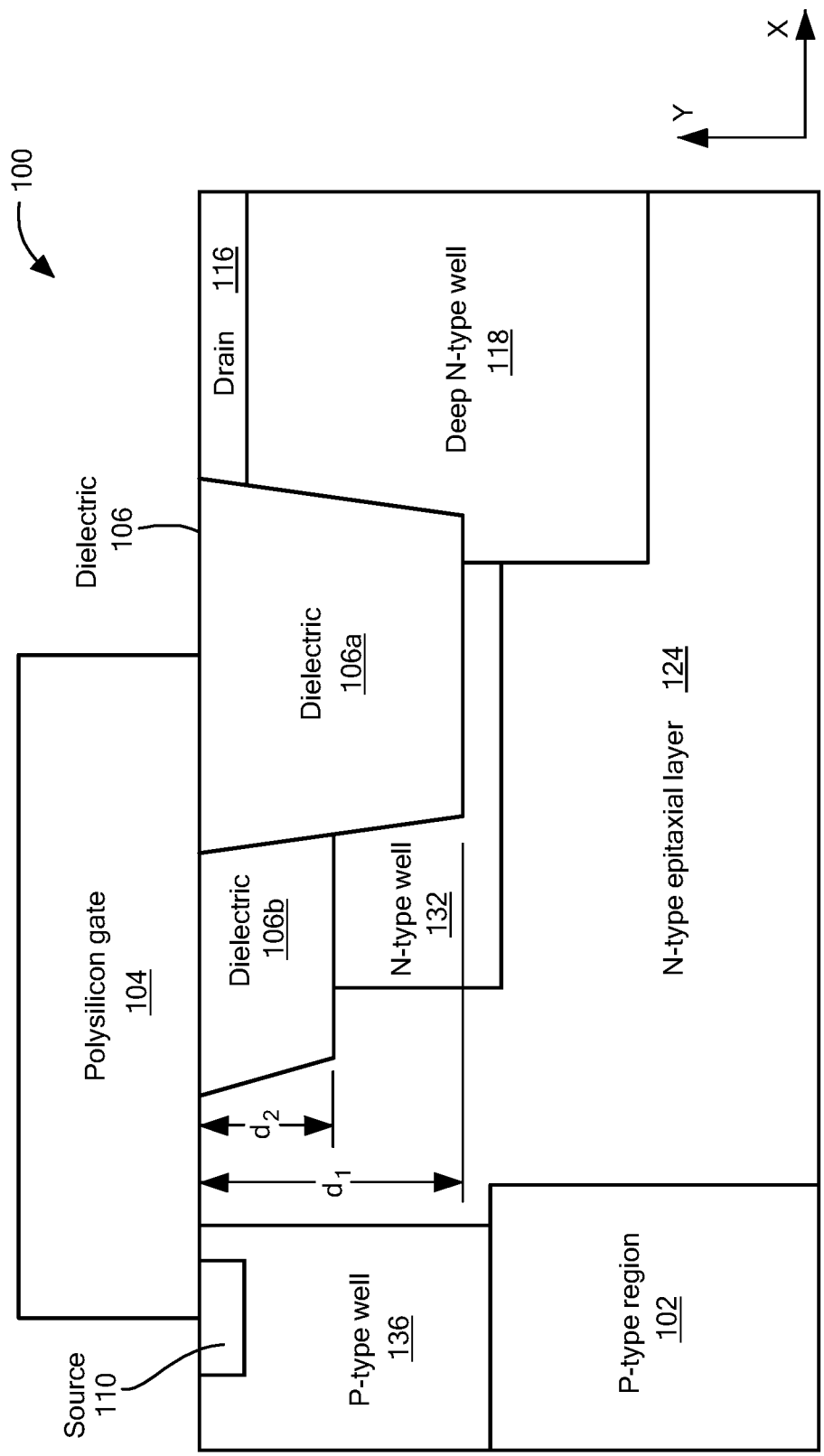
FIG. 1 is a cross-sectional diagram of an example of a double-diffused metal-oxide-semiconductor (DMOS) transistor with a recessed dielectric.

Referring to FIG. 1, an example of a DMOS transistor with a recessed dielectric is a DMOS transistor 100. The DMOS transistor 100 includes a p-type region 102, a polysilicon gate 104, a dielectric 106 directly below the gate 104, a source 110, a drain 116, a deep n-type well 118 directly below the drain 116, a n-type epitaxial layer 124, a n-type well 132, and a p-type well 136 directly below the source. The n-type epitaxial layer 124 is directly below the p-type well 136, the dielectric 106 the n-type well 132 and the deep n-type well 118.

The dielectric 106 includes a dielectric 106a and a dielectric 106b. In one example, the dielectric 106a and the dielectric 106b are the same material. In one example the dielectric 106a and the dielectric 106b are silicon dioxide. In other examples, the dielectric 106a and the dielectric 106b are different materials.

The dielectric 106a extends a distance $d_1$ in the Y-direction, and the dielectric 106b extends a distance $d_2$ in the Y-direction. $d_1$ corresponds to a thickness of the dielectric 106a and $d_2$ corresponds to a thickness of the dielectric 106b. With $d_1 > d_2$, the dielectric 106b is recessed or thinner with respect to the dielectric 106a.

The dielectric 106a is thick enough to protect the gate 104 from high voltage that may come from the drain 116 resulting from, for example, electrostatic discharge (ESD). By having the dielectric 106b thinner than the dielectric 106a, electrons that are activated during a high voltage event have a shorter path to traverse from the drain 116 to the source 110 than if the dielectric 106b was as thick as the dielectric 106a. A width of the dielectric 106a in the X-direction is shorter than traditional DMOS transistors and therefore the DMOS transistor 100 has a lower on-resistance than traditional DMOS transistors.

The deep n-type well 118 extends into the n-type epitaxial layer 124 at least 10,000 Angstroms±2,000 Angstroms. In one example, the deep n-type well 118 is linearly doped.

The DMOS transistor 100 includes a reduced surface field (RESURF). The RESURF is formed by the polysilicon gate 104, the dielectric 106, and the n-type well 132.

Figure 2:
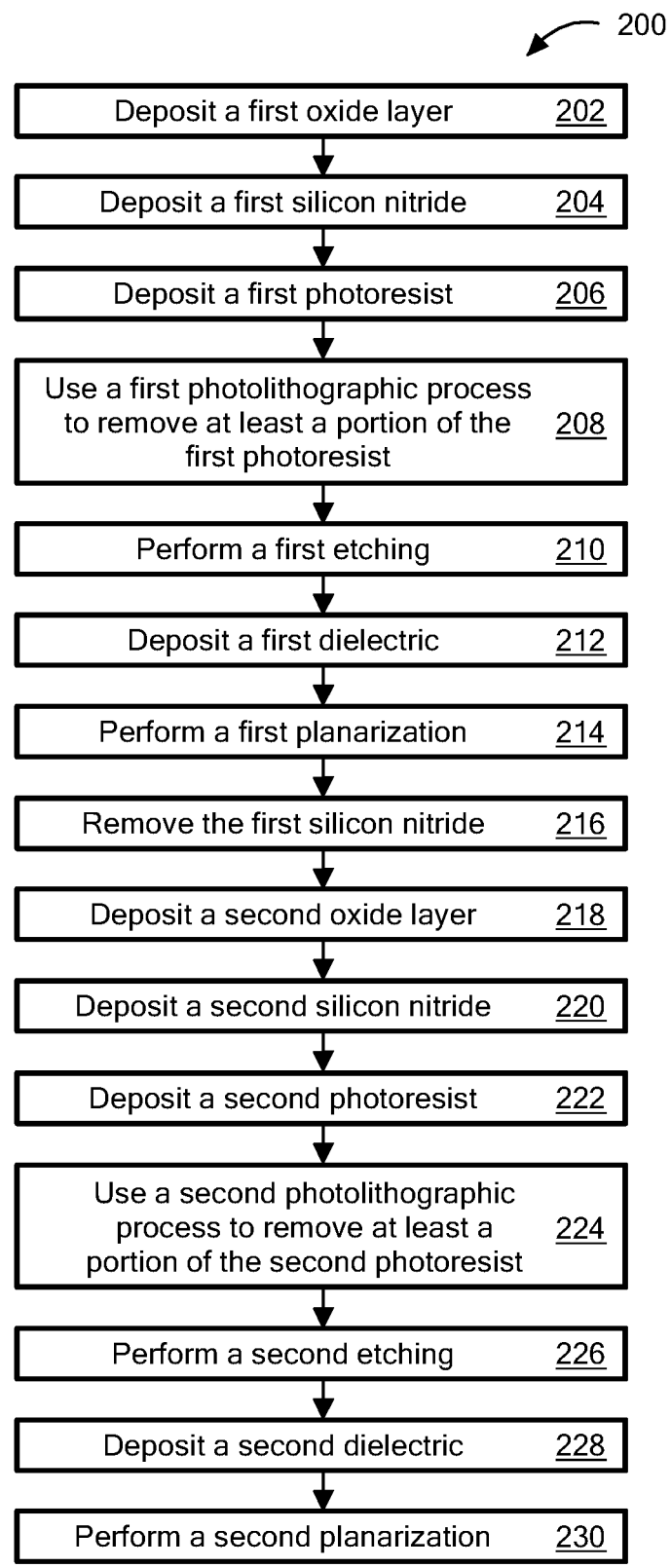
FIG. 2 is a flowchart of an example of a process used to fabricate a DMOS transistor with a recessed dielectric.

Referring to FIG. 2, an example of a process used to fabricate a DMOS transistor with a recessed dielectric is a process 200. In one example, all or some of the process 200 may be used in a process to fabricate the DMOS transistor 100 (FIG. 1).

Process 200 deposits a first oxide layer (202). In one example, the first oxide layer is silicon dioxide. In one example, the first oxide layer is 200 Angstrom thick±20 Angstroms. In one example, the first oxide layer is deposited on the deep n-type well 118 and the n-type well 132 (FIG. 1).

Process 200 deposits a first silicon nitride (204). For example, a first silicon nitride layer is deposited on the first oxide layer, the deep n-type well 118 and the n-type well 132 (FIG. 1). In one example, the first silicon nitride layer is 1,500 Angstroms thick±15 Angstroms.

Process 200 deposits a first photoresist (206) and uses a first a photolithographic process to remove at least a portion of the first photoresist (208). For example, a first photoresist is deposited on the first silicon nitride, and the photolithographic process is used to remove at least a portion of the first photoresist to expose at least a portion of the first silicon nitride and/or the first oxide layer that will be etched.

Process 200 performs a first etching (210). For example, the at least exposed portion of the first silicon nitride and/or first oxide layer is etched, and the deep n-type well 118 and the n-type well 132 (FIG. 1) underneath the etched first silicon nitride and/or etched first oxide is also etched. In one example, the deep n-type well 118 and the n-type well 132 (FIG. 1) are etched 4,000 Angstroms±400 Angstroms.

Process 200 deposits a first dielectric (212). For example, a high-density-plasma (HDP) chemical vapor deposition (CVD) process is used to deposit the dielectric 106a (FIG. 1). In one example, the first dielectric is silicon dioxide. In one example, the first dielectric is 6,000 Angstroms±600 Angstroms thick.

Process 200 performs a first planarization (214). In one example, the first dielectric is planarized using a chemical-mechanical planarization (CMP) process. In one example, the first oxide layer applied in processing block 202 is also removed.

Process 200 removes the first silicon nitride (216). For example, the first silicon nitride is removed by phosphoric acid. In one example, the first photoresist is also removed.

Process 200 deposits a second oxide layer (218). In one example, the second oxide layer is silicon dioxide. In one example, the second oxide layer is 200 Angstrom thick±20 Angstroms.

Process 200 deposits a second silicon nitride (220). For example, a second silicon nitride layer is deposited on the second oxide layer, the n-type epitaxial layer 124 and the n-well 132 (FIG. 1). In one example, the second silicon nitride layer is 1,500 Angstroms thick±150 Angstroms.

Process 200 deposits a second photoresist (222) and uses a second a photolithographic process to remove at least a portion of the second photoresist (224). For example, a second photoresist is deposited on the second silicon nitride, and the photolithographic process is used to remove at least a portion of the second photoresist to expose at least a portion of the second silicon nitride and/or the second oxide layer that will be etched.

Process 200 performs a second etching (226). For example, the at least exposed portion of the second silicon nitride and/or the second oxide is etched, and the n-type epitaxial layer 124 and the n-type well 132 (FIG. 1) underneath the etched second silicon nitride and/or etched second oxide is also etched. In one example, the n-type epitaxial layer 124 and the n-type well 132 are etched 2,000 Angstroms±200 Angstroms.

Process 200 deposits a second dielectric (228). For example, a HDP CVD process is used to deposit the dielectric 106b next to and in contact with the dielectric 106a (FIG. 1). In one example, the second dielectric is silicon dioxide. In one example, the second dielectric is 4,000 Angstroms±400 Angstroms thick.

Process 200 performs a second planarization (230). In one example, the second dielectric is planarized using a CMP process. In one example, the second oxide layer applied in processing block 218 is also removed.

Figure 3:
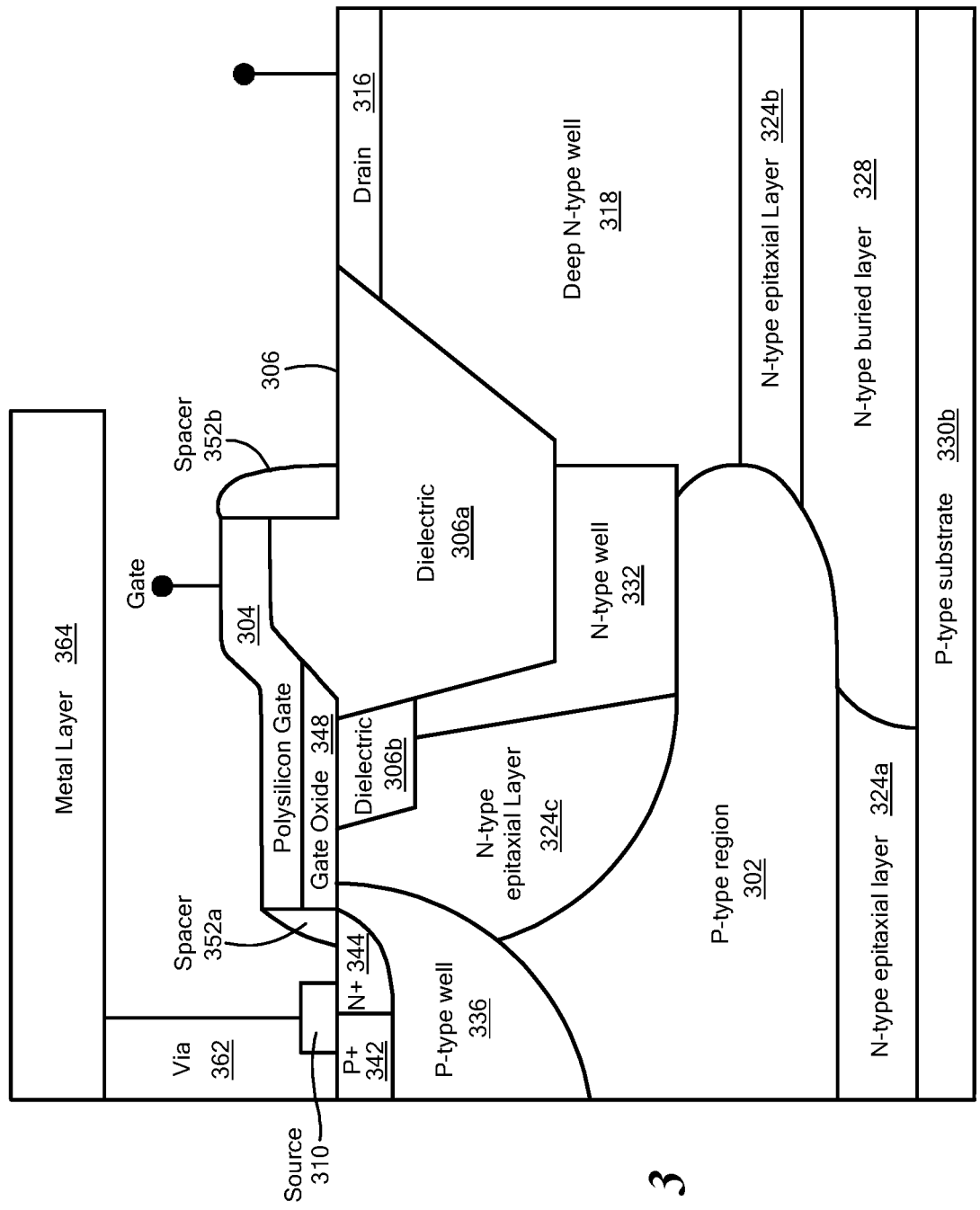
FIG. 3 is a cross-sectional diagram of another example of a DMOS transistor with a recessed dielectric.

Referring to FIG. 3, another example of a DMOS transistor with a recessed dielectric is a DMOS transistor 300. All or some of the process 200 (FIG. 2) may be used to fabricate the DMOS transistor 300.

The DMOS transistor 300 includes a p-type region 302; a polysilicon gate 304a; dielectric 306; a source 310; a drain 316; a deep n-type well 318; n-epitaxial layer 324, which includes a first portion 324a, a second portion 324b and a third portion 324c; a n-type buried layer 328; a p-type substrate 330; a n-type well 332; a p-type well 336; a gate oxide 348 between the polysilicon gate 304 and the dielectric 106; and spacers 352a, 352 on each side of the polysilicon gate 304.

The DMOS transistor 300 also includes a via 362 connected to the source 310; a metal layer 364 connected to the via 362; a P+ region 342 disposed between the p-type well 336 and the source 310; and a N+ region 344 next to the P+ region 342 and disposed between the p-type well 336 and the source 310.

The DMOS transistor 300 has three RESURFs or a triple RESURF. The three RESURFs include the n-type epitaxial layer 324c, n-type well 332, the deep n-type well 318, the p-type well 336, the p-type region 302 and the n-type buried layer 328. The n-type epitaxial layer 324c, the n-type well 332 and the deep n-type well 318 are linearly doped in the drift region resulting in a double RESURF. The p-type well 336, the p-type region 302 and the n-type buried layer 328 form the triple RESURF by completely depleting the p-type region 302 because of the high doping (e.g., on the order of $1 \times 10^{19}/cm^3$) of the n-type buried layer 328. The n-type buried layer 328 also isolates the p-type well 336 and the p-type region 302 from the p-type substrate 330 by preventing minority carrier flowing into p-type substrate 330.

In addition, the DMOS transistor 300 is configured to provide a decrease in on-resistance compared to traditional devices. For example, the p-type well 336 provides a very shallow channel length of about 0.1 microns that decreases on-resistance by 10 to 20% from a nominal Rsp with a longer channel such as 0.3 um.

The processes described herein are not limited to the specific examples described. For example, the process 200 is not limited to the specific processing order of FIG. 2. Rather, any of the processing blocks of FIG. 2 may be re-ordered, combined, or removed, performed in parallel or in serial, as necessary, to achieve the results set forth above.

Having described embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method comprising:
   forming a double-diffused metal oxide semiconductor (DMOS) comprising:
   depositing a first silicon nitride on a well;
   depositing a first photoresist on the first silicon nitride;
   using a first photolithographic process to remove portions of the first photoresist to expose at least one portion of the first silicon nitride;
   performing a first etching of the first silicon nitride and the well;
   depositing a first dielectric on a portion of the well etched by the first etching;
   removing the first silicon nitride;
   depositing a second silicon nitride on the well and an epitaxial layer;
   depositing a second photoresist on the second silicon nitride;
   using a second photolithographic process to remove portions of the second photoresist to expose at least one portion of the second silicon nitride;
   performing a second etching of the second silicon nitride, the well, and the epitaxial layer; and
   depositing a second dielectric on a portion of the well and the epitaxial layer etched by the second etching, wherein the second dielectric is in direct contact with the first dielectric.

2. The method of claim 1, further comprising performing a chemical-mechanical polishing (CMP) on the first dielectric.

3. The method of claim 2, further comprising performing CMP on the second dielectric.

4. The method of claim 1, wherein depositing the first dielectric comprises depositing a first layer of silicon dioxide.

5. The method of claim 4, wherein depositing the first dielectric comprises depositing the first dielectric using high-density-plasma (HDP) Chemical Vapor Deposition (CVD).

6. The method of claim 5, wherein depositing the second dielectric comprises depositing a second layer of silicon dioxide,
   wherein depositing the second dielectric comprises depositing the second dielectric using HDPCVD.

7. The method of claim 6, wherein depositing the second layer of silicon dioxide comprises depositing a second layer of silicon dioxide that is thinner than the first layer of silicon dioxide.

8. The method of claim 7, wherein the first layer has a thickness of about 6,000 Angstroms, and
   wherein the second layer has a thickness of about 4,000 Angstroms.

9. The method of claim 8, further comprising depositing an oxide layer of about 200 Angstroms on the silicon substrate before depositing the first silicon nitride.

10. The method of claim 1, further comprising depositing an oxide on the silicon substrate before depositing the first silicon nitride.

* * * * *